United States Patent
Chen et al.

(10) Patent No.: US 11,132,075 B2
(45) Date of Patent: Sep. 28, 2021

(54) TOUCHPAD AND DISPLAY SCREEN THEREOF

(71) Applicants: BOE TECHNOLOGY GROUP CO., LTD., Beijing (CN); Hefei Xinsheng Optoelectronics Technology Co., Ltd., Anhui (CN)

(72) Inventors: Jun Chen, Beijing (CN); Qicheng Chen, Beijing (CN); Ming Zhang, Beijing (CN); Tsungchieh Kuo, Beijing (CN); Xianlin Ding, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 440 days.

(21) Appl. No.: 16/098,234

(22) PCT Filed: Mar. 23, 2018

(86) PCT No.: PCT/CN2018/080101
§ 371 (c)(1),
(2) Date: Nov. 1, 2018

(87) PCT Pub. No.: WO2018/210056
PCT Pub. Date: Nov. 22, 2018

(65) Prior Publication Data
US 2021/0096667 A1      Apr. 1, 2021

(30) Foreign Application Priority Data
May 16, 2017    (CN) .......................... 201710344650.1

(51) Int. Cl.
*G06F 3/041* (2006.01)
*H01L 27/32* (2006.01)

(52) U.S. Cl.
CPC .... *G06F 3/041* (2013.01); *G06F 2203/04102* (2013.01); *G06F 2203/04103* (2013.01); *H01L 27/323* (2013.01)

(58) Field of Classification Search
CPC combination set(s) only.
See application file for complete search history.

(56) References Cited

U.S. PATENT DOCUMENTS

| 2004/0188150 A1* | 9/2004 | Richard | G06F 3/045 178/18.01 |
| 2011/0304568 A1* | 12/2011 | Kim | G06F 3/045 345/173 |

(Continued)

FOREIGN PATENT DOCUMENTS

| CN | 102999196 A | 3/2013 |
| CN | 103927049 A | 7/2014 |

(Continued)

OTHER PUBLICATIONS

Search Report and Written Opinion for International Application No. PCT/CN2018/080101 dated Jun. 27, 2018.

(Continued)

*Primary Examiner* — Temesghen Ghebretinsae
*Assistant Examiner* — Sosina Abebe
(74) *Attorney, Agent, or Firm* — Calfee, Halter & Griswold LLP

(57) ABSTRACT

The disclosure provides a touchpad and a display screen thereof. The touchpad includes a first touch electrode assembly and a second touch electrode assembly; the first touch electrode assembly includes a first touch electrode and a first organic insulating layer covering the first touch electrode; and the second touch electrode assembly includes a second touch electrode and a second organic insulating layer covering the second touch electrode. The touch electrode includes a metal layer, a buffer layer and a low reflection (Continued)

layer, the buffer layer being disposed below the metal layer, and the low reflection layer being disposed above the metal layer.

13 Claims, 2 Drawing Sheets

(56) References Cited

U.S. PATENT DOCUMENTS

| | | | |
|---|---|---|---|
| 2013/0063820 A1 | 3/2013 | Yang et al. | |
| 2014/0042398 A1* | 2/2014 | Choi | H01L 51/50 257/40 |
| 2014/0062909 A1* | 3/2014 | Choi | G06F 3/041 345/173 |
| 2014/0168540 A1* | 6/2014 | Wang | G06F 3/0443 349/12 |
| 2014/0197018 A1* | 7/2014 | Chen | G06F 3/0445 200/600 |
| 2016/0062518 A1* | 3/2016 | Ding | G06F 3/0445 345/174 |
| 2016/0139708 A1* | 5/2016 | Tseng | G06F 3/0446 345/174 |
| 2016/0342278 A1* | 11/2016 | Yu | H01L 27/1262 |
| 2017/0123543 A1* | 5/2017 | Choi | H01L 27/323 |
| 2018/0033617 A1* | 2/2018 | Imazeki | H01L 21/74 |
| 2018/0151662 A1* | 5/2018 | Rhe | G06F 3/0412 |
| 2019/0243482 A1* | 8/2019 | Kimura | C23C 14/083 |

FOREIGN PATENT DOCUMENTS

| | | |
|---|---|---|
| CN | 203759670 U | 8/2014 |
| CN | 104166490 A | 11/2014 |
| CN | 105929998 A | 9/2016 |
| CN | 105997058 A | 10/2016 |
| CN | 107168580 A | 9/2017 |
| TW | 201426424 A | 7/2014 |

OTHER PUBLICATIONS

First Office Action for Chinese Patent Application No. 201710344650.1 dated Feb. 26, 2019.

* cited by examiner

Before de-shadowing　　　　　　　After de-shadowing

TOUCHPAD AND DISPLAY SCREEN THEREOF

RELATED APPLICATIONS

The present application is the U.S. national phase entry of PCT/CN2018/080101, with an international filing date of Mar. 23, 2018, which claims the benefit of Chinese Patent Application CN201710344650.1 filed on May 16, 2017, the entire disclosures of which are incorporated herein by reference.

FIELD OF THE INVENTION

The disclosure relates to the field of display technology, and in particular, to the field of flexible touch display technology.

BACKGROUND OF THE INVENTION

With the development of science and technology, the development of flexible display OLEDs (Organic Light Emitting Diodes) has become more and more rapid and popular. Alongside the development of flexible OLEDs for display, flexible touch screens have also developed. A traditional touch screen is prepared on a glass base material using ITO (indium tin oxide) as a sensing electrode and metal as a wire. Due to the change of the flexible base material, the preparation of inductive sensors and metal wirings on the base material faces new challenges.

SUMMARY OF THE INVENTION

According to an embodiment of the disclosure, there is provided a touch electrode disposed on a substrate, wherein the touch electrode includes a metal layer and a buffer layer, the metal layer is made of metal with good ductility and used as an electrode wire of the touch electrode, and the buffer layer is made of metal or metal alloy which improves the adhesion force between the metal layer and the substrate, and wherein the buffer layer is disposed between the metal layer and the substrate.

In an embodiment, above the metal layer is disposed a metal oxide layer with low reflectivity.

In an embodiment, the metal layer is made of Ag or Cu.

In an embodiment, the buffer layer is selected from one or a combination of Mo, Mo alloy, Ti, and Ti alloy.

In an embodiment, the metal oxide is at least one of Ag oxide, Ag alloy oxide, Cu oxide, Mo oxide, MoNb alloy oxide, Ti oxide, and Ti alloy oxide.

According to another embodiment of the disclosure, there is provided a touchpad including at least one first touch electrode assembly and at least one second touch electrode assembly, the first touch electrode assembly including a first touch electrode and a first organic insulating layer covering the first touch electrode, and the second touch electrode assembly including a second touch electrode and a second organic insulating layer covering the second touch electrode, wherein the first touch electrode and the second touch electrode are any of the touch electrodes as described above.

In an embodiment, the second organic insulating layer is on the first organic insulating layer in a direction far away from the substrate, and a refractive index of the first organic insulating layer is less than that of the second organic insulating layer.

In an embodiment, the refractive index of the first organic insulating layer is less than or equal to 1.4, and the refractive index of the second organic insulating layer is greater than or equal to 1.6.

In an embodiment, a thickness of the first organic insulating layer is equal to that of the second organic insulating layer.

In an embodiment, the thickness of the first organic insulating layer is 0.5-4 um, and the thickness of the second organic insulating layer is 0.5-4 um.

According to a further aspect of the disclosure, there is provided a touch display screen including any of the touchpads as described above.

This Summary introduces some concepts of the invention in a simplified form that are further described below in the Detailed Description. This Summary is not intended to give necessary features or essential features of the claimed subject matter, nor is it intended to limit the scope of the claimed subject matter. In addition, as described herein, various other features and advantages may also be incorporated into the techniques as needed.

BRIEF DESCRIPTION OF THE DRAWINGS

In order to more clearly illustrate the technical solutions of some embodiments of the disclosure, the disclosure provides the following appended drawings to be used in the description of the embodiments, which constitute a part of the specification and are used for explaining the technical solutions of some embodiments of the disclosure along with the embodiments of the disclosure. It should be appreciated that, the drawings in the following description only relate to some embodiments and do not constitute a limitation to the technical solutions of the invention, and for the person having ordinary skills in the art, other drawings may also be obtained according to these drawings under the premise of not paying out creative labor, which other drawings also fall within the scope of the invention.

DETAILED DESCRIPTION OF THE INVENTION

In the related art, flexible touch screens employ ITO as the electrode, however, a problem of cracking and shedding will occur to the ITO when a bending test is performed on the flexible substrate if the ITO is evaporation-plated by magnetron sputtering.

Currently, the ITO with the thickness no more than 200 Å may satisfy the requirement for the bending test of the flexible base film, that is, the problem of cracking and shedding will not occur. However, the limitation of the ITO film thickness results in that the square resistance of the ITO is too large, which severely restricts the size and the touch performance of the flexible touch screens.

To increase the size and the touch performance of the flexible touch screens and meanwhile, satisfy the requirement for the bending test of the flexible touch screens, this disclosure proposes a metal-mesh screen printing structure prepared by using a metal with high ductility as the inductive sensor to improve the bending performance of the flexible screens.

However, the metal electrode array formed by etching the metal on the glass substrate will lead to generation of metal electrode shadow, which affects the display effect of the touch screens. This is because the reflectivity of metal is much higher than that of the surrounding area of glass substrate with no metal, and thus the difference in reflectivity between the two areas is large, the visual contrast is clear, and the naked eye can observe the metal electrode shadow. With respect to the problem that there is metal electrode shadow for the metal touch glass, this disclosure achieves metal appearance de-shadowing by a laminated design of metal reflectivity and adopts the buffer layer adhesion force to satisfy the reliability requirement.

In particular, the disclosure provides a touchpad, a touch display screen and a touch electrode included therein, relates to the field of display technology, and can solve the problem of poor touch performance of the related art touchpad.

In the following the technical solutions of embodiments of the disclosure will be described clearly and completely in conjunction with the drawings. It may be appreciated by the person having ordinary skills in the art that the described embodiments are just a part of the embodiments of the invention, and not all the embodiments. Based on the embodiments of the disclosure, all the other embodiments obtained by the person having ordinary skills in the art under the premise of not paying out creative labor pertain to the scope protected by the invention.

According to an embodiment of the disclosure, there is provided a touch display screen including a touchpad structure and a flexible display panel, the touchpad structure may further include a touch electrode.

Figure 1:
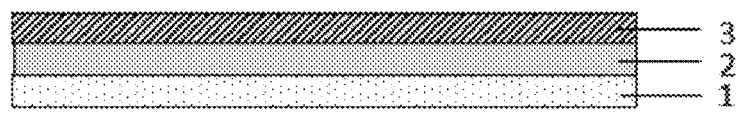
FIG. 1 is a schematic diagram of a specific structure of a touch electrode provided according to an embodiment of the disclosure.
Figure 2:
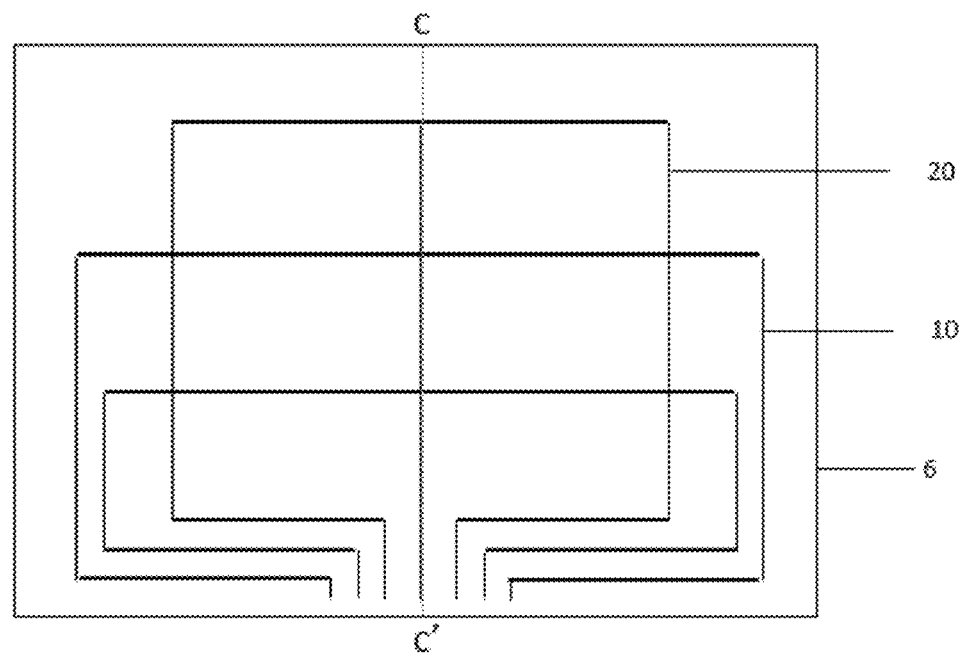
FIG. 2 is a schematic diagram of a planar structure of a touchpad provided according to an embodiment of the disclosure.

FIG. 1 shows a schematic diagram of a specific structure of a touch electrode according to an embodiment of the disclosure. For example, the touch electrode may be a first touch electrode 10 as shown in FIG. 2. As shown in FIG. 1, the first touch electrode 10 includes a first metal layer 2, a first buffer layer 1, and a first low reflection layer 3. The first buffer layer 1 may be made of metal or metal alloy, e.g., Mo or Mo alloy, Ti or Ti alloy, and is used to improve the adhesion force between the metal layer and the substrate, such that the touchpad is stably combined with the substrate. Meanwhile, the first buffer layer 1 has good ductility, which meets requirement for diverse bending changes of the substrate especially in flexible display, but is not only limited to the flexible display. The first metal layer 2 is located over the first buffer layer 1, and the first metal layer 2 is made of metal with good ductility, such as Ag, Cu, etc., and used as an electrode wire of the touch electrode. Compared with the traditional touch electrode material ITO, the square resistance of the metal touch electrode is small, and its signal-to-noise ratio is large, which effectively improves the touch sensitivity of the touch screen. The first low reflection layer 3 is located over the first metal layer 2, and the first low reflection layer 3 is made of a metal oxide, for example, Ag or Ag alloy oxide, Cu or Cu oxide, Mo or MoNb alloy oxide, Ti or Ti alloy oxide. The first low reflection layer 3 may effectively reduce the reflection of light on the surface of the first touch electrode 10, and thereby may achieve the purpose of metal de-shadowing.

FIG. 2 shows a schematic diagram of a planar structure of a touchpad provided according to an embodiment of the disclosure. This touchpad includes at least one first touch electrode 10 and at least one second touch electrode 20. An example structure of the first touch electrode 10 is shown in FIG. 1, and the second touch electrode 20 may also adopt the same structure as the first touch electrode 10. The arrangement of the first touch electrode 10 and the second touch electrode 20 may be as shown in FIG. 2, wherein a plurality of first touch electrodes 10 are disposed in parallel and at intervals, a plurality of second touch electrodes 20 are disposed in parallel and at intervals, and the plurality of first touch electrodes 10 and the plurality of second touch electrodes 20 are disposed crosswise. The first touch electrode 10 may be taken as Rx, the second touch electrode 20 may be taken as Tx, and an insulating layer is used for isolation between the first touch electrode 10 and the second touch electrode 20. In the related art, the reflectivity of the metal for the touch electrode is much higher than that of the surrounding area of glass substrate with no metal, and the visual contrast is too clear due to the difference in reflectivity between the two areas being large. With respect to the problem that there is metal electrode shadow for the metal touch glass, some embodiments of the disclosure achieve metal appearance de-shadowing by a laminated design of organic insulating layers.

Figure 3:
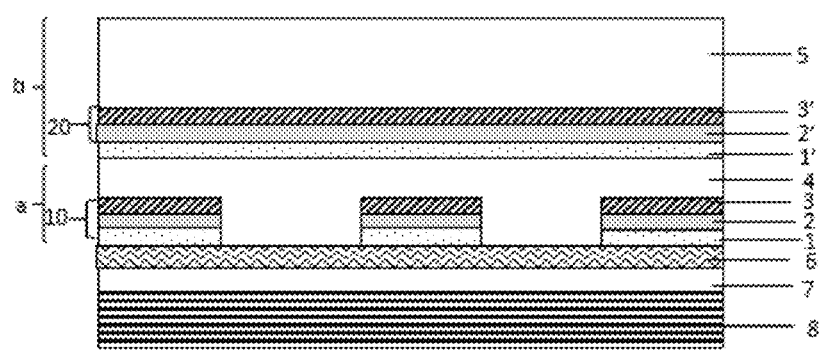
FIG. 3 is a schematic diagram of a cross-sectional structure of a display screen including a touchpad provided according to an embodiment of the disclosure.

FIG. 3 shows a schematic diagram of a cross-sectional structure (the cross section of the location c-c' in FIG. 2) of a display screen including a touchpad provided according to an embodiment of the disclosure. The display screen includes an organic electroluminescent device OLED panel 8, a flexible substrate 6, a binder 7 (OCA) disposed between the OLED panel 8 and the flexible substrate 6. Through the binder 7, the OLED panel 8 and the flexible substrate 6 are attached together. The touchpad is disposed on the flexible substrate 6, and the touchpad includes a first touch electrode assembly a and a second touch electrode assembly b. The second touch electrode assembly b may be disposed on the first touch electrode assembly a in a direction far away from the substrate. The first touch electrode assembly a includes a first touch electrode 10 and a first organic insulating layer 4 covering the first touch electrode 10. The second touch electrode assembly b includes a second touch electrode 20 and a second organic insulating layer 5 covering the second touch electrode 20. The first touch electrode 10 may include a first metal layer 2, a first buffer layer 1, and a first low reflection layer 3. The second touch electrode 20 may include a second metal layer 2', a second buffer layer 1', and a second low reflection layer 3'. The first/second metal layer 2/2' is disposed above the first/second buffer layer 1/1', and the first/second low reflection layer 3/3' is disposed above the first/second metal layer 2/2'.

In an embodiment, the refractive index of the first organic insulating layer 4 is less than that of the second organic insulating layer 5. For example, the refractive index of the first organic insulating layer may be less than or equal to 1.4, and the refractive index of the second organic insulating layer may be greater than or equal to 1.6. The thickness of the first organic insulating layer 4 may be set equal to that of the second organic insulating layer 5. For example, the thickness of the first organic insulating layer 4 may be set to 0.5-4 um, and the thickness of the second organic insulating layer 5 may also be set to 0.5-4 um. Since the light passes the two organic insulating layers with different refractive indexes and is reflected, and the reflectivity of the metal area and the metal-free area is close to the same, the effect of metal de-shadowing may be achieved.

Figure 4A:
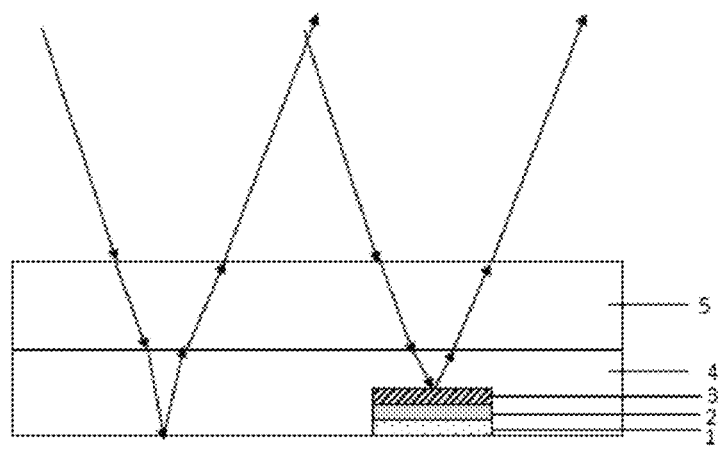
FIG. 4A is a structural diagram of the principle of metal de-shadowing of a touchpad according to an embodiment of the disclosure.
Figure 4B:
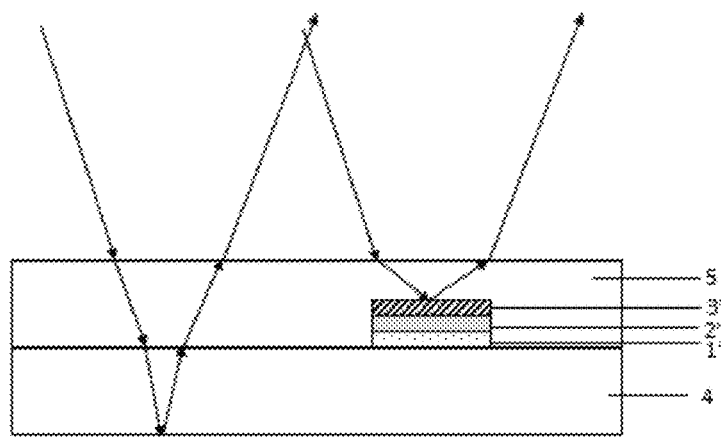
FIG. 4B is a structural diagram of the principle of metal de-shadowing of a touchpad according to an embodiment of the disclosure.

FIG. 4 shows a structural diagram of the principle of metal de-shadowing of a touchpad according to an embodiment of the disclosure. In particular, as shown in FIG. 4, the reflection in the metal area and the reflection in the metal-free area are divided into two situations: the first situation is as shown in FIG. 4A, in which the reflection light includes reflection light reflected by the first metal layer 2 and reflection light not reflected by any metal layer; and the second situation is as shown in FIG. 4B, in which the reflection light includes reflection light reflected by the second metal layer 2' and reflection light not reflected by any metal layer. Use of the second organic insulating layer 5 with a high refractive index together with the first organic insulating layer 4 with a low refractive index may cause the difference in reflection between the metal reflection area and the metal-free area to be decreased, meanwhile, the first low reflection layer 3 and the second low reflection layer 3' on the first metal layer 2 and the second metal layer 2' further reduce the reflection of the light, and under a combination of the both, the metal reflection area and the metal-free reflection area become consistent, thereby solving the problem of metal de-shadowing.

Figure 5:
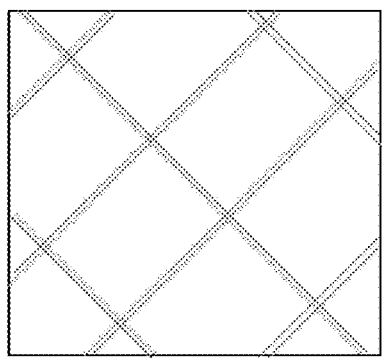
FIG. 5 is an effect drawing of metal de-shadowing of a touch display screen according to an embodiment of the disclosure.
Figure 5:
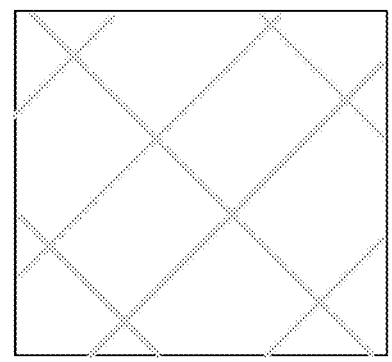

FIG. 5 shows an effect drawing of metal de-shadowing of a touch display screen according to an embodiment of the disclosure. By the laminated design of metal layers with low reflectivity and organic insulating film layers, the reflection at the metal line mesh is reduced, such that it is the same as that at the metal-free line mesh, and in such a way, the metal line appearance is not obvious. In the embodiment in the figure, an incident wavelength of 550 nm is employed, the thickness of the first organic insulating layer 4 is 1.5 um, the value of the refractive index n is 1.5, the thickness of the second organic insulating layer 5 is 1.5 um, the value of the refractive index n is 1.9; the first and second low reflection layers 3/3' are Cu oxide metal films; and the first and second metal layers 2/2' are Cu, and the first and second buffer layer 1/1' are Ti alloy. Metal surface blackening may reduce the reflectance index to be 11% to 22%, and by using organic insulating film layers with different high and low refractive indexes in collocation, the reflectivity may be caused to be closer, to achieve the effect of de-shadowing as shown in FIG. 5.

The use of metal Ag, Cu with good ductility in place of the transparent conductive layer ITO may meet the requirements of flexibility and bending resistance, and meanwhile, increase the touch sensitivity and improve the touch performance due to low impedance of the touch screen; the use of the buffer layer design solves the problem of low adhesion force of metal; the use of a low reflection layer on a metal layer in collocation reduces the metal reflection; and the use of an organic insulating film layer with a high refractive index and an organic insulating film layer with a low refractive index in collocation causes the reflection of the metal reflection area and the metal-free area to be consistent, and solves the problem of metal de-shadowing.

In touch screens of some embodiments of the disclosure, ITO is replaced by a metal material with higher bending resistance, such as Ag or Cu, and an inductive sensor is prepared by preparing a metal-mesh. Since the square resistance of the metal is lower, the requirements for a large size and high performance touch may be achieved. The disclosure further proposes a laminated design scheme in which at the bottom of the metal layer a buffer layer is prepared to improve the adhesion force, on the top of the metal layer a low reflection layer is prepared to reduce the reflectivity, and at the same time, two materials with different high and low refractive indexes are used to prepare the organic insulating layers, which ensures that the reflectivity of the metal line area is consistent with that of the metal-line-free area and achieves the purpose of metal de-shadowing.

It may be appreciated that, what are described above are just exemplary embodiments of the invention, however, the protective scope of the invention is not limited thereto. It should be noted that, various variations or alternatives may readily occur to the person having ordinary skills in the art without departing from the spirit and principle of the invention, and these variations or alternatives should all be encompassed in the protective scope of the invention. Therefore, the protective scope of the invention should be subject to the protective scope of the appended claims.

It needs to be noted that, the above embodiments are just illustrated by division of the above various functional modules, and in a practical application, the above functions may be allocated to different functional modules for accomplishment as needed. It may be possible to divide the internal structure of the apparatus into different functional modules to accomplish all or part of the above described functions. In addition, the function of one module described above may be accomplished by multiple modules, and the functions of multiple modules described above may also be integrated into one module for accomplishment.

In the claims, any reference sign placed between the parentheses shall not be construed as limiting to a claim. The term "include" does not exclude the presence of elements or steps other than those listed in a claim. The word "a" or "an" preceding an element does not exclude the presence of a plurality of such elements. The invention may be implemented by means of a hardware including several distinct elements, or by means of suitably programmed software or firmware, or by any combination thereof.

In a device or system claim enumerating several apparatuses, one or more of the apparatuses may be embodied by one and the same hardware item. The mere fact that certain measures are recited in mutually different dependent claims does not indicate that a combination of these measures cannot be used to advantage.

The invention claimed is:

1. A touchpad, including at least one first touch electrode assembly and at least one second touch electrode assembly, the first touch electrode assembly including a first touch electrode and a first organic insulating layer covering the first touch electrode, and the second touch electrode assembly including a second touch electrode and a second organic insulating layer covering the second touch electrode, wherein each of the first touch electrode and the second touch electrode include a metal layer and a buffer layer, the metal layer is made of metal with good ductility and used as an electrode wire of the touch electrode, and the buffer layer is made of metal or metal alloy which improves an adhesion force between the metal layer and the substrate, and the buffer layer is disposed between the metal layer and the substrate, and wherein the second touch electrode assembly is on the first touch electrode assembly in a direction far away from the substrate, and a refractive index of the first organic insulating layer is less than a refractive index of the second organic insulating layer so that a reflectivity of a metal reflection area in the touchpad is consistent with that of a metal-free reflection area in the touchpad.

2. The touchpad as claimed in claim 1, wherein the refractive index of the first organic insulating layer is less than or equal to 1.4, and the refractive index of the second organic insulating layer is greater than or equal to 1.6.

3. The touchpad as claimed in claim 2, wherein a thickness of the first organic insulating layer is equal to a thickness of the second organic insulating layer.

4. The touchpad as claimed in claim 1, wherein a thickness of the first organic insulating layer is equal to a thickness of the second organic insulating layer.

5. The touchpad as claimed in claim 4, wherein the thickness of the first organic insulating layer is 0.5-4 um, and the thickness of the second organic insulating layer is 0.5-4 um.

6. A touch display screen, including a touchpad as claimed in claim 1.

7. The touch display screen as claimed in claim 6, wherein the refractive index of the first organic insulating layer is less than or equal to 1.4, and the refractive index of the second organic insulating layer is greater than or equal to 1.6.

8. The touch display screen as claimed in claim 6, wherein a thickness of the first organic insulating layer is equal to a thickness of the second organic insulating layer.

9. The touch display screen as claimed in claim 8, wherein the thickness of the first organic insulating layer is 0.5-4 um, and the thickness of the second organic insulating layer is 0.5-4 um.

10. The touchpad as claimed in claim 1, wherein a metal oxide layer is disposed above the metal layer.

11. The touchpad as claimed in claim 10, wherein the metal oxide layer includes a metal oxide, and where the metal oxide is at least one of: Ag oxide, Ag alloy oxide, Cu oxide, Mo oxide, MoNb alloy oxide, Ti oxide, and Ti alloy oxide.

12. The touchpad as claimed in claim 1, wherein the metal layer is made of Ag or Cu.

13. The touchpad as claimed in claim 1, wherein the buffer layer is selected from one or a combination of Mo, Mo alloy, Ti, and Ti alloy.

* * * * *